(12) United States Patent
Park et al.

(10) Patent No.: US 7,863,126 B2
(45) Date of Patent: Jan. 4, 2011

(54) FABRICATION OF A CMOS STRUCTURE WITH A HIGH-K DIELECTRIC LAYER OXIDIZING AN ALUMINUM LAYER IN PFET REGION

(75) Inventors: Dae-Gyu Park, Poughquaq, NY (US); Michael P. Chudzik, Danbury, CT (US); Vijay Narayanan, New York, NY (US); Vamsi Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 322 days.

(21) Appl. No.: 12/120,658

(22) Filed: May 15, 2008

(65) Prior Publication Data

US 2009/0283838 A1 Nov. 19, 2009

(51) Int. Cl.
*H01L 21/441* (2006.01)

(52) U.S. Cl. .................... 438/216; 438/591; 438/592; 438/658; 438/660; 257/369; 257/392; 257/E21.438; 257/E21.47

(58) Field of Classification Search .................. 438/216
See application file for complete search history.

(56) References Cited

U.S. PATENT DOCUMENTS

| | | | |
|---|---|---|---|
| 6,506,676 B2 | 1/2003 | Park | 438/683 |
| 6,790,731 B2 | 9/2004 | Zheng | 438/283 |
| 6,794,232 B2 | 9/2004 | Zheng | 438/186 |
| 6,879,009 B2 | 4/2005 | Zheng | 257/407 |
| 7,208,353 B2 | 4/2007 | Yagishita | 438/149 |
| 7,242,064 B2 | 7/2007 | Yagishita | 257/401 |
| 7,432,567 B2 * | 10/2008 | Doris et al. | 257/407 |
| 7,528,024 B2 * | 5/2009 | Colombo et al. | 438/176 |
| 7,655,550 B2 * | 2/2010 | Schaeffer et al. | 438/592 |
| 2002/0130340 A1 * | 9/2002 | Ma et al. | 257/295 |
| 2004/0238859 A1 * | 12/2004 | Polishchuk et al. | 257/274 |
| 2004/0245578 A1 * | 12/2004 | Park et al. | 257/369 |
| 2005/0282329 A1 * | 12/2005 | Li | 438/216 |
| 2006/0038236 A1 * | 2/2006 | Yamamoto | 257/368 |
| 2009/0212369 A1 * | 8/2009 | Park et al. | 257/368 |
| 2009/0218632 A1 * | 9/2009 | Cheng | 257/369 |
| 2009/0263950 A1 * | 10/2009 | Koyama et al. | 438/287 |

OTHER PUBLICATIONS

U.S. Appl. No. 11/745,994, filed May 8, 2007, B. B. Doris.
U.S. Appl. No. 12/037,158, filed Feb. 26, 2008, D. G. Park.
V. Narayanan et al., "IEEE VLSI Symposium", p. 224, (2006).
Guha et al., Appl. Phys. Lett. 90, 092902 (2007).

* cited by examiner

*Primary Examiner*—Wael M Fahmy
*Assistant Examiner*—Abul Kalam
(74) *Attorney, Agent, or Firm*—George Sai-Halasz; Louis J. Percello

(57) ABSTRACT

A method for fabricating a CMOS structure is disclosed. The method includes the blanket disposition of a high-k gate insulator layer in an NFET device and in a PFET device, and the implementation of a gate metal layer over the NFET device. This is followed by a blanket disposition of an Al layer over both the NFET device and the PFET device. The method further involves a blanket disposition of a shared gate metal layer over the Al layer. When the PFET device is exposed to a thermal annealing, the high-k dielectric oxidizes the Al layer, thereby turning the Al layer into a PFET interfacial control layer, while in the NFET device the Al becomes a region of the metal gate.

10 Claims, 3 Drawing Sheets

FABRICATION OF A CMOS STRUCTURE WITH A HIGH-K DIELECTRIC LAYER OXIDIZING AN ALUMINUM LAYER IN PFET REGION

FIELD OF THE INVENTION

The present invention relates to high performance electronic circuits. In particular, it relates to CMOS devices having high-k gate dielectrics, and metal containing gates.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials. One such Si based material of importance for microelectronics is the silicon-germanium (SiGe) alloy. The devices in the embodiments of the present disclosure are typically part of the art of single crystal Si based material device technology.

There is great difficulty in maintaining performance improvements in devices of deeply submicron generations. Therefore, methods for improving performance without scaling down dimensions have become of interest. There is a promising avenue toward higher gate capacitance without having to make the gate dielectric actually thinner. This approach involves the use of so called high-k materials. The dielectric constant of such materials is higher than that of $SiO_2$, which is about 3.9. A high-k material may physically be thicker than an oxide, and still have a lower equivalent oxide thickness (EOT) value. The EOT, a concept known in the art, refers to the thickness of such an $SiO_2$ layer which has the same capacitance per unit area as the insulator layer in question. In today state of the art FET devices, one is aiming at an EOT of below 2 nm, and preferably below 1 nm.

Device performance is also enhanced by the use of metal gates. The depletion region in the poly-Si next to the gate insulator can become an obstacle in increasing gate-to-channel capacitance. The solution is to use a metal gate. Metal gates also assure good conductivity along the width direction of the devices, reducing possible RC delays in the gate.

High performance small FET devices are in need of precise threshold voltage control. As operating voltage decreases, to 2V and lower, threshold voltages also have to decrease, and threshold variation becomes less tolerable. Every new element, such as a different gate dielectric, or a different gate material, influences the threshold voltage. Techniques exist to tune device thresholds through the modification of the gate workfunction. Typically such techniques are complicated, involving many masking steps. There is need for simpler fabrication methods for threshold tuned CMOS structures and circuits.

SUMMARY OF THE INVENTION

Embodiments of the present invention disclose a method for fabricating a CMOS structure. The method includes the blanket disposition of a gate insulator layer for an NFET device and for a PFET device. This gate insulator layer includes a high-k dielectric layer. The method also includes implementing an NFET gate conductor layer overlaying the gate insulator layer in the NFET device. This is followed by blanket disposition of an Al layer over the NFET gate conductor layer, and in the PFET device, over the high-k dielectric of the gate insulator layer. The method further involves the blanket disposition of a shared gate metal layer over the Al layer, while insuring that prior to disposing the shared gate metal layer the Al layer is free of oxygen. When the PFET device is exposed to a thermal annealing, the high-k dielectric oxidizes the Al layer, thereby turning the Al layer into a PFET interfacial control layer, modifying the gate workfunction.

BRIEF DESCRIPTION OF THE DRAWINGS

These and other features of the present invention will become apparent from the accompanying detailed description and drawings, wherein.

DETAILED DESCRIPTION OF THE INVENTION

Figure 1:
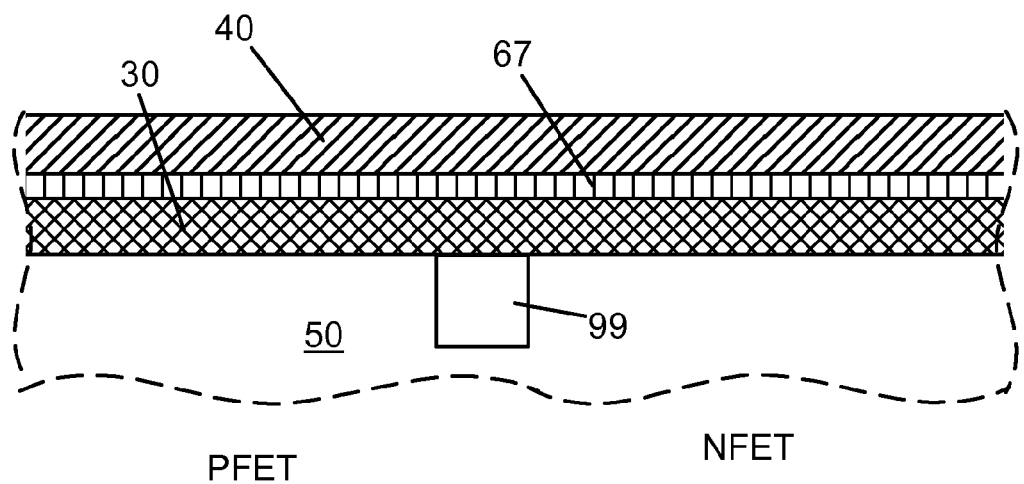
FIG. 1 shows a schematic cross section of processing in an embodiment of the invention where a common high-k dielectric and a metal layer for an NFET gate stack have been implemented.

It is understood that Field Effect Transistor-s (FET) are well known in the electronic arts. Standard components of a FET are the source, the drain, the body inbetween the source and the drain, and the gate. The body is usually part of a substrate, and it is often called substrate. The gate is overlaying the body and is capable to induce a conducting channel in the body between the source and the drain. In the usual nomenclature, the channel is hosted by the body. The gate is separated from the body by the gate insulator, or dielectric. The FET source and drain are often referred to simply as electrodes. The electrodes adjoin the induced conductive channel and are capable of being in electrical continuity with the induced conductive channel. There are two type of FET devices: a hole conduction type, called PFET, and an electron conduction type, called NFET. Often, but not exclusively, PFET and NFET devices are combined into CMOS structures. Other nomenclatures used in the art for such PFET and NFET device combinations are CMOS devices, CMOS device structures, CMOS circuits, and others.

In FET operation an inherent electrical attribute is the threshold voltage. When the voltage between the source and the gate exceeds the threshold voltage, the FETs are capable to carry current between the source and the drain. Since the threshold is a voltage difference between the source and the gate of the device, in general, NFET threshold voltages are positive, and PFET threshold voltages are negative.

As FET devices are scaled to smaller size, the traditional way of setting threshold voltage, namely by adjusting body and channel doping, loses effectiveness. The workfunction of the gate, and the gate insulator properties are becoming important factors in determining the thresholds of small FETs. Such, so called small FETs have typically gate lengths, or gate stack lengths, of less than 50 nm, and operate in the range of less than about 1.5 V. The gate stack length, or gate length, is defined in the direction of the device current flow between the source and the drain. For small FETs the technology is progressing toward the use of metallic gates and high-k dielectrics for gate insulators. However, an optimal combination of a particular metal gate with a particular high-k dielectric in the gate insulator from a performance, or processing point of view, might not lead to optimal threshold values for the devices.

In small devices with low EOT gate insulators, the workfunction of the gate may significantly influence the threshold voltage. In the general terminology of the art, one characterizes the workfunction of the gate in relation to the Si band gap. For instance, in the art the term "band-edge workfunction" means that the gate has a workfunction like that of $n^+$, or $p^+$ Si. Similarly, "mid-gap", or "quarter-gap" workfunction mean a gate appearing to have a workfunction roughly like intrinsic silicon, or one halfway between intrinsic Si and heavily doped Si.

When a metal gate, such as for instance TiN, is used in conjunction with a high-k gate dielectric, such as, for instance, $HfO_2$, often the threshold corresponds to a workfunction that is not too far from mid-gap.

The gate insulator may also influence the device threshold. Various dielectric materials in the gate insulators, or various processing treatments of the gate insulator may change the device threshold. The gate insulator in such cases acts as if one were to modify the workfunction of the gate.

It was already studied and observed that a layer of a threshold modifying material, a so called interfacial control layer, added to a high-k dielectric layer, such as an $HfO_2$ layer, with appropriate processing treatment, can shift the workfunction of the metal gate. A metal-oxide compound interfacial control layer, where the metals are coming from the Group IIA and IIIB columns of the periodic table, can shift the effective-workfunction of the metal gate, such as TiN, in the n-direction. The terms "n-direction", or "p-direction", mean that the threshold of the device shifts in a way as if the gate workfunction were to move toward the values of $n^+$, or $p^+$ Si. In general, the n-direction means that the threshold shifts in the direction of negative voltage, for instance from 0.5 V to 0.2 V. While p-direction means that the threshold shifts in the direction of positive voltage, for instance from −0.5 V to −0.2 V.

Examples of n-direction, or "n" interfacial control layers (NICL) may be $La_2O_3$, MgO, BaO, and several other oxides. The effect of such NICL has been already reported in the art, for instance by V. Narayanan et al. in "IEEE VLSI Symposium", p. 224, (2006), and by Guha et al. in Appl. Phys. Lett. 90, 092902 (2007). Recently p-direction, or "p" interfacial control layers (PICL) have been disclosed, in the form of aluminum oxide and/or aluminum nitride layers. The disclosure of "p" interfacial control layers can be found in U.S. patent application Ser. No. 12/037,158, filed Feb. 26, 2008, by D. G. Park et al., incorporated herein by reference.

If in the processing of CMOS circuit chips one could use the same gate metal material for both type of FET devices, it would lead to a greatly simplified fabrication process relative to the one using differing metals for the differing device types. Being able to use the same high-k dielectric material in the gate insulators, as well, would further improve the simplicity of fabrication. Simplicity in a process means cost savings, both because of fewer steps in the process, and because of presumably higher yield.

Embodiments of the present invention introduce a "p" interfacial control layer (PICL) in a simple an novel manner. The PFET and NFET device may use the same, commonly deposited, high-k dielectric in the gate insulators, and a shared commonly deposited gate metal layer. The PICL is introduced as a simple blanket aluminum layer disposition, over both the PFET and NFET devices. This aluminum layer in the PFET device is turned into a PICL, while in the NFET device it becomes imbedded in the metal gate. Blanket dispositions of shared layers lead to simplified, and more effective, processing by reducing masking steps. Reduced number of masking steps also may be enabling, in that it may allow for self-alignments instead of less precise lithographic alignments.

FIG. 1 shows a schematic cross section of processing in an embodiment of the invention where a common high-k dielectric and a metal layer for the NFET gate stack have been applied. Manufacturing of NFET, PFET, and CMOS is very well established in the art. It is understood that there are a large number of steps involved in such processing, and each step might have practically endless variations known to those skilled in the art. It is further understood that the whole range of known processing techniques are available for fabricating the disclosed device structures, and only those process steps will be detailed that are of interest for embodiments of the present invention.

The figure shows what typically may be only a small fraction of an electronic chip, for instance a processor, as indicated by the wavy dashed line boundaries. The schematic representation of FIG. 1, as well as of all other figures, implies no real size relationships between the various depicted elements.

FIG. 1 shows device bodies 50 for the defined PFET and NFET device regions. The device bodies 50 are of a Si based, or Ge based, or possibly of a compound semiconductor material, or mixed substrate such as group IV and group III-V semiconductor materials, typically of single crystal. In a representative embodiment of the invention the Si based material bodies 50 are essentially Si. In exemplary embodiments of the invention the device bodies 50 are part of a substrate. The substrate may be any type known in the electronic art, such as, without the intent of limitation: bulk, or semiconductor on insulator (SOI), fully depleted, or partially depleted, FIN type, or any other kind. Also, substrates may have various wells of various conductivity types, in various nested positioning enclosing device bodies. The devices may be isolated from one another by any method known in the art. The figure shows a shallow trench 99 isolation scheme, as this is a typical advanced isolation technique available in the art.

FIG. 1 shows a state in the processing where a gate insulator layer has been blanket disposed for both NFET and PFET devices of a CMOS structure. Blanket disposition, typically deposition by known means in the art, is advantageous since it does not need masking. The gate insulator layer includes a high-k dielectric 30. There are many suitable high-k dielectrics for gate insulators, as know in the art. Examples, without intent of limiting, are $ZrO_2$, $HfO_2$, HfSiO, HfSiON. In representative embodiments of the present invention the high-k dielectric may be selected to be a Hf containing dielectric, such as $HfO_2$. The gate insulator layer may also include a thin film overlaying the body 50, not shown in FIG. 1. Such a thin film may be an oxide, which under typical fabrication conditions may even be difficult to avoid, in the form of a native silicon oxide. However, the presence of, or the lack of, any additional film either for the NFET device, or the PFET device, is of no consequence regarding embodiments of the present invention.

In FIG. 1 also shows an NFET interfacial control layer (NICL) 67 covering the high-k dielectric layer 30, as part of the gate insulator layer. For embodiments of the invention such a NICL 67 is optional, as it may be omitted. The use of an NICL 67 depends on particular needs for the NFET device threshold, which needs may be different for different applications. The composition of such a NICL layer 67, as known in the art, typically is an oxide of at least one element selected from the combination of groups IIA and IIIB of the periodic table of the elements. It may be, for instance, selected to be lanthanum oxide. Its thickness is typically less than about 1 nm.

An NFET gate conductor layer 40 is overlaying the gate insulator layer. In typical embodiments, the NFET gate conductor layer 40 is blanket disposed without masking, as shown in FIG. 1. The NFET gate conductor layer 40 in representative embodiments of the invention is TiN. It may also be Ti-rich TiN, or it may be a different metal, any one known in the art serving such a purpose. Ti-rich TiN means a Ti:N ratio over 1. The thickness of the NFET gate conductor layer 40 may be between 1.5 nm and 15 nm, typically about 10 nm. In the art there are known techniques for disposing a TiN layer. Usually it is done by various kind of depositions, such as, without limitation, atomic layer deposition (ALD), chemical vapor deposition (CVD), physical vapor deposition (PVD).

The choice for the NFET gate conductor layer 40 may depend on the desired threshold value for the NFET device. Choosing TiN and combining it with an NICL layer 67 gives about an "n" band edge workfunction. Using Ti rich TiN and no NICL layer 67, yields about an "n" quarter gap workfunction.

Figure 2:
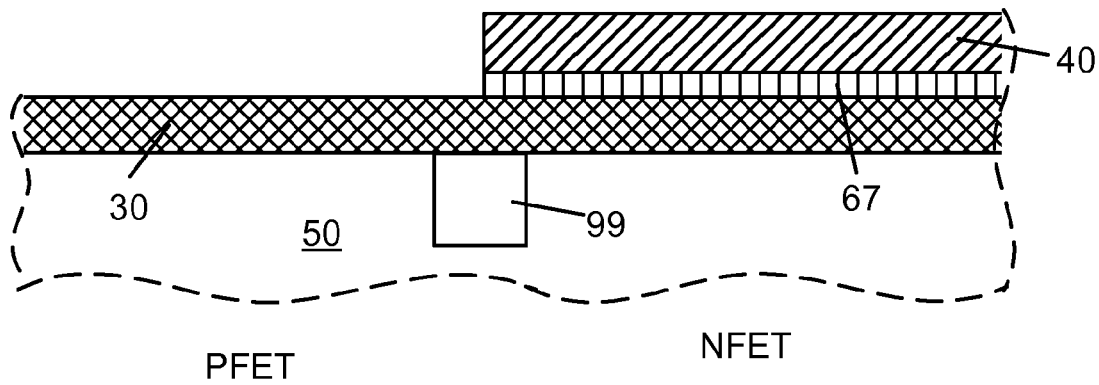
FIG. 2 shows a schematic cross section of processing in an embodiment of the invention after removing all material covering the high-k dielectric in the PFET device.

FIG. 2 shows a schematic cross section of processing in an embodiment of the invention, after removing all material covering the high-k dielectric in the PFET device. This figure shows a state in the fabrication where the implementation of the NFET gate conductor layer 40 has mainly been completed. In representative embodiments, although the NFET gate conductor layer 40 was blanket deposited, at this stage it is removed by etching from the PFET regions. Such etching techniques are known in the art. They typically involve a mask, for protecting the NFET regions, and a differential etch which can stop on the gate insulator. Such techniques may be reactive ion etching (RIE), or wet etching. The NFET gate conductor layer 40 is rather thin, and its removal over the PFET devices would not cause problems.

Following the metal removal, if there is another layer over the high-k dielectric 30, such as, for instance, an NICL layer 67, then that layer is also removed. Such insulating layers typically are so thin, that their removal may be done by a simple timed etch, for instance in HCl containing wet chemicals, or in diluted HF (DHF), until the high-k dielectric 30 is exposed.

Figure 3:
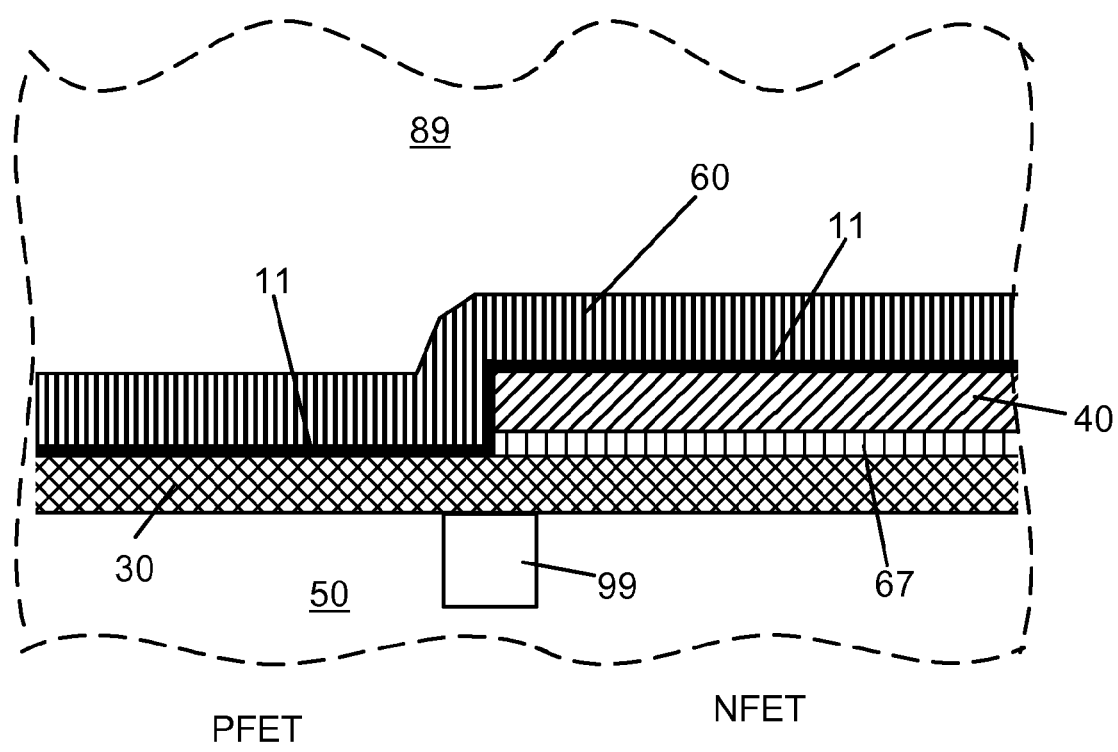
FIG. 3 shows a schematic cross section of processing in an embodiment of the invention after implementing an aluminum layer and a shared gate metal layer.

FIG. 3 shows a schematic cross section of the processing where an aluminum layer and a shared gate metal layer have been implemented. An aluminum (AL) layer 11 is blanket disposed over the NFET gate conductor layer 40 and over the high-k dielectric 30 of the gate insulator layer in the PFET device. The Al thickness is typically about between about 0.2 nm and 2 nm. The disposition of the Al layer 11 is done along lines known in the art, typically by a deposition technique. Such techniques may include, without limitation, PVD, ALD, CVD, with PVD being the typical.

The disposition of the Al layer is followed by another blanket disposition, that of a shared gate metal layer 60. The naming "shared" implies that this layer 60 will end up in the gate stack of both type of devices. In representative embodiments of the invention the shared metal layer 60 is TiN, and has a thickness of between about 5 nm and about 15 nm. The disposition of the shared gate metal layer 60 is carried out in such manner to insure that prior to disposing the shared gate metal layer 60, the Al layer 11 is free of oxygen. Since Al oxidized readily upon contact with oxygen, care has to be taken to either prevent oxygen exposure of the Al layer 11 before having it covered by the shared metal layer 60, or, if there is oxidization, then the oxidized portion of the Al layer is removed. Both, prevention of oxidation and removal of oxide, can proceed in manners known in the art.

In typical embodiments of the invention the Al layer 11 and the TiN shared metal layer 60 would be in situ deposited. In situ deposition means, that the operations of depositing Al and TiN are carried out in the same system, without the device structure being exposed to air inbetween the depositions. Usually this means that the substrate remains in vacuum, even if it has to be moved between deposition chambers. However, in situ deposition has many variations known in the art, and any, and all, may be utilized, without limitation.

The disposition of the shared metal layer 60 is usually followed by deposition of other layers 89, as known in the art. Such layers may include, for instance, amorphous and/or polycrystalline silicon. However, the composition, or other attributes, of such layers 89 covering the shared metal layer 60, are of no significance for embodiments of the invention, as the marking with the vague wavy line boundary is intended to convey.

Due to follow-up processing, the completed devices will contain in their gate stacks the layers shown in FIG. 3. The PFET gate stack will contain the high-k dielectric layer 30, the Al layer 11, and the shared metal layer 60. Before the fabrication is completed the PFET device is to be exposed to a thermal annealing. Such an annealing can be done with rapid thermal annealing (RTP) techniques, or by a furnace annealing. The annealing temperature may be between about 500° C. and about 1300° C. During this annealing the high-k dielectric 30, which contains sufficient oxygen, oxidizes the thin Al layer 11. This oxidation turns the Al layer 11 into a PFET interfacial control layer. The oxidized aluminum is not a metallic conductor, but an insulator, namely aluminum oxide, which is a "p" interfacial control layer (PICL), causing the workfunction of the PFET gate to shift in the "p" direction.

It is understood that although the stoichiometric chemical composition of bulk aluminum oxide is $Al_2O_3$, for such thin layers as the PICL, due to interfacial effects and possible intermixing between various layers, the average composition may not match exactly its supposed bulk, stoichiometric, composition. Therefore, in case of the PICL aluminum oxide it is understood that one might think of the average composition as $AlO_x$, with "x" as the oxygen to aluminum ratio, being not necessarily equal to 1.5.

One might carry out the thermal annealing of the PFET device, for the oxidation of the Al layer, with a fabrication step designed specifically for this purpose. However, in typical embodiments of the invention such a separate thermal step would not be necessary. After the stage in processing shown in FIG. 3, in customary CMOS processing there are usually high thermal-budget steps yet to be performed. One such thermal step is the source and drain annealing. Consequently, one has the option to have the oxidizing of the Al layer to occur simultaneously with the source/drain annealing. Furthermore, in CMOS processing there are other than the source/drain fabrication steps where thermal budgets are expended. Overall, it is not likely that in a typical embodiment of the invention one would have to introduce a separate thermal treatment step for the oxidation of the Al layer 11, but if necessary, a separate, distinct thermal step option is available.

In a typical flow of CMOS fabrication when one type of device receives a thermal treatment the other type receives the same, since usually they are in close proximity on a chip being processed. This means that when the Al layer 11 is being oxidized for the PFET gate, one has to be concerned about the effects of heating, and possibly even melting, the Al layer 11 in the NFET. Embodiments of the present invention present the solution of this concern. The thin NFET gate conductor layer 40 was deposited to eliminate the influence of the Al layer on the NFET. In the NFET device the Al layer is sandwiched between two metal layers, the NFET gate conductor layer 40 and the shared metal layer 60. Furthermore, it was insured that the Al layer 11 is not oxidized prior to the disposal of the shared metal layer 60. Accordingly, in the NFET the Al layer 11 is a metal layer between two other metal layers. Since it is free of oxygen the Al layer conductivity is excellent, poses no unwanted resistance. Thus, even if heated and melted, the Al layer 11 has no effect on the NFET. In typical embodiments of the invention the NFET gate conductor layer 40 and the shared metal layer 60 both are TiN, and if the Al melts probably the only effect is some intermixing between metals, forming a TiAlN alloy. Such alloy may form, as well, at the time of the shared metal layer 60 disposition.

As presented in FIGS. 1-3, embodiments of the present invention, using a very simple process, are fabricating a sophisticated CMOS structure. During the presented processing there is only one masking step introduced, the one used in removing material over the high-k dielectric 30 of the PFET device. All other processing steps involve blanket operations, without need of masking and alignment. The result of this simple process is a CMOS structure which has optimized thresholds for both devices. Through the use of PICL, the workfunction is modified in the PFET. While for the NFET, one can use the properties of the NFET gate conductor layer 40 for reaching a desired NFET threshold, or as shown, one may introduce a NICL layer, as well. All the while, a single blanket deposited shared metal layer 60, typically TiN, is the basic metal layer for both devices.

If a CMOS fabrication process is able to avoid the alignment need for block level masks, as it is done for embodiments of the present invention by using a single shared metal layer 60, one gains the additional advantage of being able to increase circuit layout density. A block level mask is the kind used, for instance, to protect one type of device when the gate metal of the other type of device is being processed. The improved circuit density comes about due to butting of device junctions, or electrodes. Such butting becomes possible when block level mask alignment is not necessary. A detailed description of the relation between butted electrodes and metal gates fabricated of a shared gate metal can be found in U.S. patent application Ser. No. 11/745,994, filed May 8, 2007, by B. B. Doris et al., incorporated herein by reference.

Figure 4:
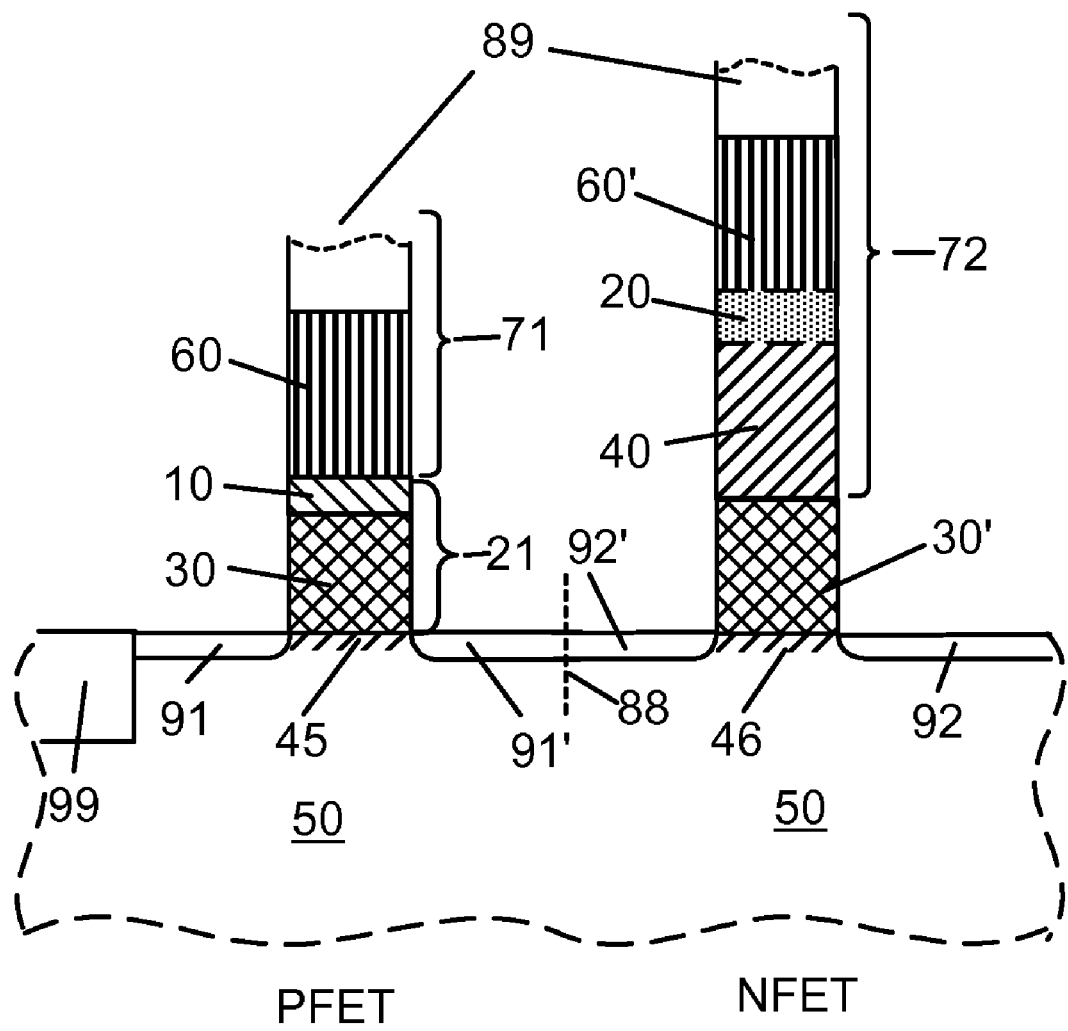
FIG. 4 shows a schematic cross section of elements of a CMOS structure in a representative embodiment of the invention.

FIG. 4 shows a schematic cross section of elements of a CMOS structure in a representative embodiment of the invention. The gate stacks for the PFET and NFET devices have been defined, and source/drain structures fabricated. It is understood that in addition to the elements of the embodiments of the invention the figure may show further elements that are standard components of FET devices.

A p-type channel 45 is hosted in the body, or substrate 50, and a PFET gate stack 71 overlaps the p-type channel 45. A PFET gate insulator 21 is inbetween the PFET gate stack 71 the and the p-type channel 45. The PFET gate stack contains a first layer of a shared gate metal 60. The PFET gate insulator 21 has at least two layers: the high-k dielectric 30, and the aluminum oxide (AlO$_x$) PICL layer 10. The PICL layer 10 is the result of the Al layer 11 disposition and its subsequent oxidation.

As discussed earlier, in exemplary embodiments of the present invention the shared gate metal is TiN. However, embodiments of the invention may use any metal that is known in the art as suitable for being a gate metal for both the shared metal layer 60, 60', and the NFET gate metal layer 40. A list of metals additional to TiN, without limitation, may be W, Mo, Mn, Ta, TaN, TaC, TaAlN, TiAlN, WN, Ru, Cr, Ta, Nb, V, Mn, Re, and their admixtures.

In addition to a first layer of the shared gate metal 60, the PFET gate stack 71 may also contain the layers 89 disposed as shown in FIG. 3, such as polycrystalline and/or amorphous Si, SiGe. Further layers may be added later during processing, for instance silicide layers. However, the nature of possible additional layers covering the first 60, PFET, and second 60', NFET, layers of the shared gate metal, are of no particular interest for the embodiments of the present invention.

The NFET device has an n-type channel 46 hosted in the body, or substrate 50, and an NFET gate stack 72 over n-type channel 46. In the embodiment depicted in FIG. 4, the NFET gate insulator, which is inbetween the NFET gate stack 72 the and the n-type channel 46, has only a layer 30' of the high-k dielectric 30 introduced in FIG. 1. In alternate embodiments the NFET gate insulator could have additional layers, such as a NICL 67, shown in other figures.

The NFET gate stack 72 has a second layer of the shared gate metal 60', and the NFET gate conductor layer 40. The NFET gate stack 72 further has a conducting region 20 containing Al, sandwiched inbetween the NFET gate conductor layer 40 and the second layer of the shared gate metal 60'. This Al containing, conducting region 40 marks the step of the blanket disposing of the Al layer 11 in earlier processing. This region may not have precisely defined boundaries, hence it is noted with dashed lines in FIG. 4, because the Al layer 11 may have nitrided or alloyed with the neighboring metal layers 40, 60'. However, it is not excluded that the conducting region 20 contains some pure Al in its elemental form.

The embodiment presented in FIG. 4 is also an example of junction butting. The PFET device has PFET electrodes 91, 91', including a first electrode 91', and the NFET device has NFET electrodes 92, 92', including a second electrode 92'. The first electrode 91' and the second electrode 92' are butted against one another in direct physical contact. The dashed line 88 indicates the dividing plane between the NFET and PFET devices. The figure also shows that one can use junction butting as a matter of choice. Isolation techniques, such as a shallow trench 99, are also available. Isolation of devices and junction butting may be readily combined within circuits on chips.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under", "over", "top", "side", "on", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

We claim:

1. A method for fabricating a CMOS structure, comprising:
   blanket disposing a gate insulator layer for an NFET device and for a PFET device, wherein said gate insulator layer comprises a high-k dielectric;
   in said NFET device, implementing an NFET gate conductor layer overlaying said gate insulator layer;
   blanket disposing an Al layer over said NFET gate conductor layer and over said high-k dielectric of said gate insulator layer in said PFET device;
   blanket disposing a shared gate metal layer over said Al layer, and insuring that prior to disposing of said shared gate metal layer said Al layer is free of oxygen; and
   exposing said PFET device to thermal annealing, wherein said high-k dielectric oxidizes said Al layer, thereby turning said Al layer into a PFET interfacial control layer.

2. The method of claim 1, wherein said exposing to thermal annealing is simultaneous with a source and drain annealing of said PFET and NFET devices.

3. The method of claim 1, wherein said implementing said NFET gate conductor layer in said NFET device comprises:
   blanket disposing said NFET gate conductor layer over said gate insulator layer;
   in said PFET device, removing all material covering said high-k dielectric.

4. The method of claim 3, wherein in said PFET device said removing all material covering said high-k dielectric comprises etching away said gate conductor layer.

5. The method of claim 4, wherein in said PFET device said removing all material covering said high-k dielectric further comprises etching said gate insulator layer until said high-k dielectric is exposed.

6. The method of claim 1, wherein said method further comprises selecting said shared gate metal layer to be TiN.

7. The method of claim 1, wherein said method further comprises selecting said NFET gate conductor layer to be TiN, with a Ti:N ratio greater than 1.

8. The method of claim 1, wherein said method further comprises selecting said gate insulator layer to further comprise an NFET interfacial control layer covering said high-k dielectric, wherein said NFET interfacial control layer is an oxide of at least one element selected from the combination of groups IIA and IIIB.

9. The method of claim 8, wherein said method further comprises selecting said NFET gate conductor layer to be of TiN.

10. The method of claim 1, further comprising:
    in said NFET device, implementing NFET electrodes, including a first electrode;
    in said PFET device, implementing PFET electrodes, including a second electrode; and
    butting in direct physical contact said first electrode and said second electrode.

* * * * *